United States Patent [19]

Takagi et al.

[11] Patent Number: 5,345,136
[45] Date of Patent: Sep. 6, 1994

[54] COMPOSITE TYPE PIEZOELECTRIC COMPONENT

[75] Inventors: Ryoji Takagi; Makoto Miyadera; Takashi Yamamoto; Ryuhei Yoshida, all of Kyota, Japan

[73] Assignee: Murata Manufacturing Co. Ltd., Japan

[21] Appl. No.: 66,321

[22] Filed: May 21, 1993

Related U.S. Application Data

[63] Continuation of Ser. No. 672,469, Mar. 18, 1991, abandoned.

[51] Int. Cl.⁵ .............................................. H01L 41/00
[52] U.S. Cl. ..................................... 310/320; 310/348; 310/366; 361/321.2
[58] Field of Search ............... 310/320, 342, 348, 358, 310/366; 361/102, 128, 321 R, 321 C, 321 CC, 321 F, 321 P, 321 T

[56] References Cited

U.S. PATENT DOCUMENTS

| | | | |
|---|---|---|---|
| 2,673,949 | 3/1954 | Khouri et al. | 361/321 |
| 4,283,650 | 8/1981 | Koyama et al. | 310/348 |
| 4,485,325 | 11/1984 | Yamamoto et al. | 310/320 |
| 4,511,202 | 4/1985 | Kasai | 310/366 |
| 4,513,350 | 4/1985 | Coleman | 361/321 |
| 4,599,677 | 7/1986 | Lawless et al. | 361/321 |
| 4,683,457 | 7/1987 | Nelson et al. | 340/347 AD |
| 4,847,730 | 7/1989 | Konno et al. | 361/306 |
| 4,856,110 | 4/1989 | Yamamoto | 361/307 |
| 5,091,671 | 2/1992 | Yoshida | 310/320 |

FOREIGN PATENT DOCUMENTS

| | | | |
|---|---|---|---|
| 60-158320 | 10/1985 | Japan | H03H 9/10 |
| 62-146317 | 9/1987 | Japan | H03H 9/10 |

*Primary Examiner*—Thomas M. Dougherty
*Attorney, Agent, or Firm*—Heller, Ehrman, White & McAuliffe

[57] ABSTRACT

A composite type piezoelectric component has electrodes formed on both major surfaces of a piezoelectric device. These electrodes are electrically connected and mechanically attached to two terminals having top ends shaped so as to receive and support both ends of the piezoelectric device. A capacitor is constructed with a pair of divided electrodes formed on one major surface of a dielectric substrate and another such pair on the other major surface thereof. The capacitor is attached to the two terminals by joining the divided electrodes on one of the major surfaces of the capacitor to the top ends of the terminals so as to leave a clearance between the capacitor and the piezoelectric device. A third terminal is connected to both of the other pair of divided electrodes. These two pairs of electrodes are substantially equally shaped such that directionality is not critical when the capacitor is attached to the terminals.

17 Claims, 3 Drawing Sheets

COMPOSITE TYPE PIEZOELECTRIC COMPONENT

This is a continuation of application Ser. No. 07/672,469, filed Mar. 18, 1991, now abandoned.

BACKGROUND OF THE INVENTION

1. Field of the Invention

The present invention relates generally to a composite type piezoelectric component combining a piezoelectric device with a capacitor, and more particularly, to a composite type piezoelectric component used as, for example, an oscillator containing load capacitances.

2. Description of the Prior Art

FIG. 9 shows one example of a conventional composite type piezoelectric component used as an oscillator containing load capacitances.

The composite type piezoelectric component shown in FIG. 9 has a piezoelectric oscillating device 2 structured such that electrodes 22 and 23 are individually formed on the mutually opposite two major surfaces of a piezoelectric substrate 21 in a long narrow rectangular plate shape. The electrodes 22 and 23 are respectively formed so as to extend from one end of the piezoelectric substrate 21 towards but without reaching the other end thereof. In addition, both the electrodes 22 and 23 are opposed to each other through the piezoelectric substrate 21 in the center of the piezoelectric substrate 21.

First and second terminals 3 and 4 are respectively joined by solder to ends of the piezoelectric oscillating device 2 constructed as described above. More specifically, respective top ends 31 and 41 of the first and second terminals 3 and 4 are formed in a semicylindrical shape, and the ends of the piezoelectric oscillating device 2 are received respectively in these semicylindrically shaped top ends 31 and 41. The electrodes 22 and 23 of the piezoelectric oscillating device 2 are respectively soldered to the top ends 31 and 41 of the first and second terminals 3 and 4 with the ends of the piezoelectric oscillating device 2 respectively received inside the ends 31 and 41 of the first and second terminals 3 and 4. For easy understanding, illustration of solder is omitted in the drawings appended to the present specification.

A capacitor 6 is fixed to the outside of the top ends 31 and 41 of the above first and second terminals 3 and 4. As shown in FIGS. 10A and 10B, the capacitor 6 in structured such that an electrode 62 is formed to cover a relatively large area on one major surface of a dielectric substrate 61 in a long narrow rectangular plate shape and a pair of electrodes 63a and 63b divided in the center is formed on the other major surface thereof. In FIG. 9, the capacitor 6 is fixed to the first and second terminals 3 and 4 by respectively soldering the divided electrodes 63a and 63b to outer surfaces of the top ends 31 and 41 of the terminals 3 and 4. Accordingly, in this oscillator containing load capacitances, a clearance which is large enough for not preventing the vibration of the piezoelectric oscillating device 2 is provided between the capacitor 6 and the piezoelectric oscillating device 2.

A top end of a stripe-shaped third terminal 5 is soldered to the electrode 62 on the other major surface of the capacitor 6.

In the above described oscillator containing load capacitances, capacitances are formed between the electrode 62 and the electrodes 63a and 63b on the capacitor 6. Consequently, an equivalent circuit of the oscillator containing load capacitances is as shown in FIG. 11. Such an oscillator containing load capacitances has been suitable for the use for, for example, a Corpitts type oscillating circuit.

In the capacitor 6 used in the above described oscillator containing load capacitances, however, the electrodes formed on the major surfaces thereof differ from each other in shape. In other words, a defective product would result if wrong major surfaces of the capacitor 6 were inadvertently attached to the terminals 3 and 4 in a step of fabrication. Therefore, in joining the capacitor 6 to the terminals 3 and 4, it was necessary to preliminarily ascertain the directionality of the capacitor 6 or to distinguish between its two major surfaces by means of a machine. Thus, the prior art fabrication process was disadvantageously complicated.

SUMMARY OF THE INVENTION

Accordingly, an object of the present invention is to provide a composite type piezoelectric component constructed by combining a piezoelectric device with a capacitor such that the fabricating processes are not complicated and defective products can be prevented from being made by erroneously mounting the capacitor with the direction of its major surfaces reversed.

The composite type piezoelectric component according to the present invention is characterized as being comprised of a piezoelectric device having a piezoelectric substrate and electrodes formed on both major surfaces of the piezoelectric substrate, and first and second terminals which are shaped so as to accept ends of the piezoelectric device therein. Both ends of the above piezoelectric device enter the top ends of the first and second terminals, and the electrodes formed on the major surfaces of the piezoelectric device are electrically connected to the first and second terminals and fixed thereto. Further, the composite type piezoelectric component comprises a capacitor having a dielectric substrate and pairs of divided electrodes on both major surfaces of its dielectric substrate. The electrodes on one of the major surfaces of the capacitor are electrically connected and fixed to the top ends of the first and second terminals with a clearance between the capacitor and the above piezoelectric device. Furthermore, the composite type piezoelectric component comprises a third terminal connected to both of the pair of divided electrodes on the other major surface of the capacitor.

The third terminal preferably has its top end connected to both of the pair of divided electrodes on the other major surface of the capacitor. Further, in accordance with a particular embodiment of the present invention, the top end of the third terminal is made wider towards the pair of divided electrodes on the other major surface of the capacitor. Furthermore, in accordance with another particular embodiment of the present invention, the third terminal is substantially T-shaped, and the top-end of the third terminal wider than the clearance between the pair of divided electrodes on the other major surface of the capacitor. Additionally, in accordance with still another particular embodiment of the invention, the top end of the third terminal has two branched portions, which are individually connected to the divided electrodes on the other major surface of the capacitor.

In the above described capacitor used in the present invention, the pairs of electrodes divided in the center are each formed one of the major surfaces of the dielectric substrate such that the shapes and relative positions the electrodes on the major surfaces of the capacitor are substantially identical to each other. Accordingly, whichever major surface of the capacitor is fixed to the first and or second terminal, the result is the same.

In the fabricating steps of the composite type piezoelectric component, therefore, when the capacitor is joined to the first and second terminals, it is possible to omit the complicated work of distinguishing between the major surfaces of the capacitor by a machine or defining the directionality of both major surfaces of the capacitor, and no defective product will result from erroneously defining the directionality of the capacitor.

Consequently, the fabricating processes can be simplified, and the production efficiency of the composite type piezoelectric component can be increased. Furthermore, in an automatic assembly, an assembling apparatus is simplified, and this makes it possible to reduce the cost and the size of the assembling apparatus.

The foregoing and other objects, features, aspects and advantages of the present invention will become more apparent from the following detailed description of the present invention, taken in conjunction with the accompanying drawings.

DESCRIPTION OF THE PREFERRED EMBODIMENTS

Figure 1:
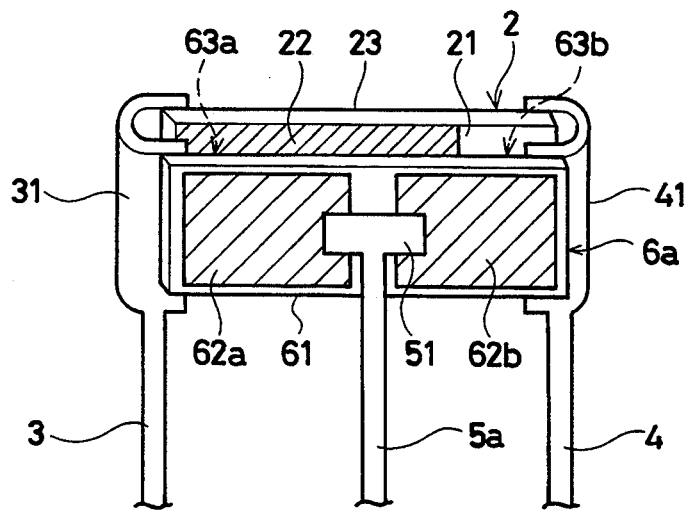
FIG. 1 is a perspective view showing a composite type piezoelectric component according to one embodiment of the present invention.

FIG. 1 is a perspective view showing a composite type piezoelectric component according to one embodiment of the present invention. The present embodiment is an improvement of the conventional oscillator containing load capacitances shown in FIG. 9. Therefore, common reference numerals are assigned to portions common to the components shown in FIG. 9.

Referring to FIG. 1, a piezoelectric oscillating device 2 is structured such that long, narrow, rectangular, planar electrodes 22 and 23 are each formed on a major surface of a piezoelectric substrate 21. The electrodes 22 and 23 are formed so as to be opposite to each other with the piezoelectric substrate 21 in between 21.

The piezoelectric oscillating device 2 is fixed to first and second terminals 3 and 4 with both ends of ends 31 and 41 of top ends 51 and 41 of the first and second terminals 3 and 4. More specifically, the top ends 31 and 41 of the first and second terminals 3 and 4 are substantially U-shaped cross-sectionally, opening towards each other. The ends of the piezoelectric oscillating device 2 are received by parts of the top ends 31 and 41 through their open parts. The electrodes 22 and 23 are attached respectively to the top ends 31 and 41 by soldering.

Figure 9:
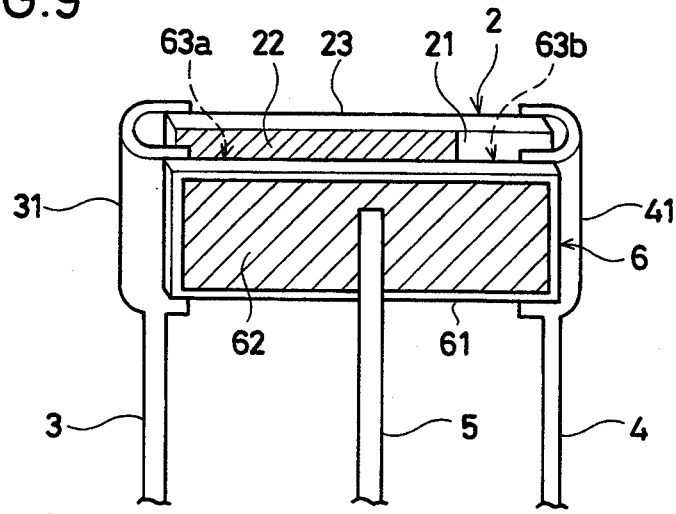
FIG. 9 is a perspective view showing one example of an oscillator containing load capacitances as a conventional composite type piezoelectric component.
Figure 10A:
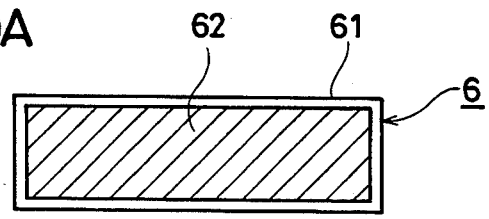
FIG. 10A is a plan view showing one major surface of a capacitor used in the oscillator containing load capacitances shown in FIG. 9.
Figure 10B:
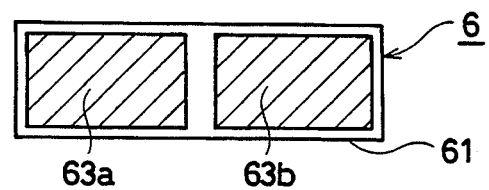
FIG. 10B is a plan view showing the other major surface of the capacitor used in the oscillator containing load capacitances shown in FIG. 9.

The piezoelectric oscillating device 2, the first and second terminals 3 and 4 and their junction structure are the same as those of the conventional oscillator containing load capacitances shown in FIG. 9. The construction of the composite type piezoelectric component according to the present embodiment is characterized by the shapes of a capacitor 6a joined to outer surfaces of the top ends 31 and 41 of the first and second terminals 3 and 4 and a third terminal 5a.

Figure 2A:
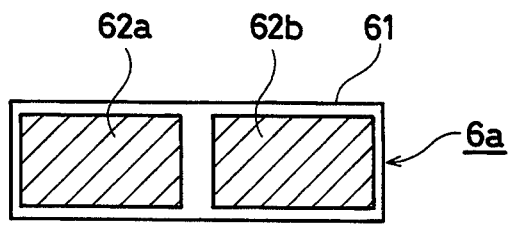
FIG. 2A is a plan view showing one major surface of a capacitor used in the embodiment shown in FIG. 1.
Figure 2B:
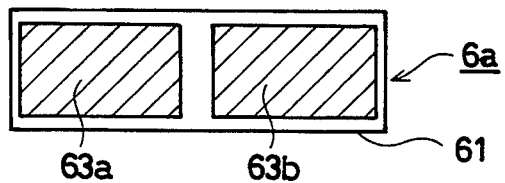
FIG. 2B is a plan view showing the other major surface of the capacitor used in the embodiment shown in FIG. 1.

More specifically, as shown in FIGS. 2A and 2B, the capacitor 6a is structured such that a pair of electrodes 62a and 62b divided at the center is formed on one of the major surfaces of a long narrow rectangular dielectric substrate 61 and a pair of electrodes 63a and 63b similarly divided at the center is formed on the other major surface 61. The electrodes 62a and 62b and the electrodes 63a and 63b are so constructed that the shapes of the electrodes on both the major surfaces of the dielectric substrate 61 are substantially identical to each other, as shown in FIGS. 2A and 2B, and the capacitance between the electrodes 62a and 63a is equal to the capacitance between the electrodes 62b and 63b.

As shown in FIG. 1, the capacitor 6a is fixed to the first and second terminals 3 and 4 with the electrodes 63a and 63b being respectively soldered to the outer surfaces of the top ends 31 and 41 of the first and second terminals 3 and 4.

Furthermore, the third terminal 5a is connected to both of the pair of electrodes 62a and 62b formed on the other major surface of the capacitor 6a. The third terminal 5a is substantially T-shaped, and its top end 51 is widened so as to bridge together the pair of divided electrodes 62a and 62b.

Figure 11:
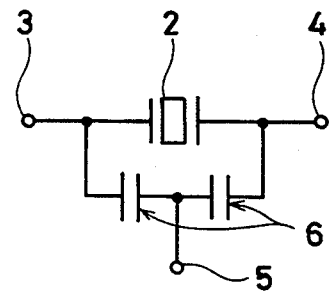
FIG. 11 is a diagram showing an equivalent circuit of the conventional composite type piezoelectric component.

Since the electrodes 62a and 62b are electrically connected together to the third terminal 5a, an equivalent circuit of the composite type piezoelectric component according to the present embodiment is also as shown in FIG. 11.

Moreover, in the present embodiment, the electrodes 62a and 62b and the electrodes 63a and 63b on both the major surfaces of the capacitor 6a are shaped substantially identically to each other and the capacitance between the electrodes 62a and 63a is equal to the capacitance between the electrodes 62b and 63b whichever major 6a may be joined to the top end 31 or 41 of the terminals 3 and 4 without effecting the equivalent circuit of the composite type piezoelectric component shown in FIG. 11.

Consequently, in the fabrication of the composite type piezoelectric component, it is possible to omit the steps of preliminarily defining the directionality of the sides of the capacitor 6a and distinguishing between sides of the capacitor 6a, say, by a machine without thereby producing defective products. Accordingly, it is possible not only to increase yield but also to simplify the fabricating processes.

In the above described embodiment, the shapes of the electrodes on the both major surfaces of the capacitor 6a are substantially the same. Even if the sides of the capacitor 6a are reversed the shapes of the electrodes formed on the major surfaces are not different enough to interfere with the step of soldering it to the top ends 31 and 41 of the terminals 3 and 4 and conduction between the divided electrodes by the top end 51 of the terminal 5a.

Figure 3:
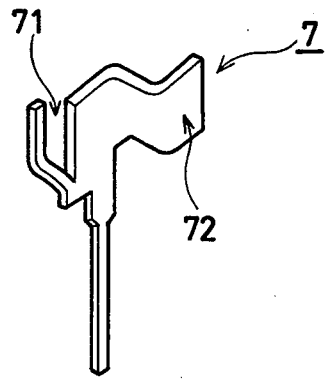
FIG. 3 is a perspective view showing another example of a third terminal.

Furthermore, the shape of the first and second terminals 3 and 4 is not limited by FIG. 1. For example, terminals shown at 7 in FIG. 3 may be used as the first and second terminals 3 and 4. In this case, the electrodes on one of the major surfaces of the piezoelectric oscillating device 2 are soldered to the terminal 7, with one of the ends of the piezoelectric oscillating device 2 received in a concave portion 71. In addition, the capacitor 6a can be fixed to the terminal 7 by soldering with the electrodes formed on one of the major surfaces of the capacitor 6a abutting a flat planar portion 72. As may be clear from the shape of the terminal 7 shown in FIG. 3, if two terminals 7 as described above are used, the capacitor 6a can be fixed to the terminals 7 with a clearance large enough for vibration of the piezoelectric oscillating device 2 between the piezoelectric oscillating device 2 and the capacitor 6a. This is similar to the situation where the terminals 3 and 4 are used.

Figure 5:
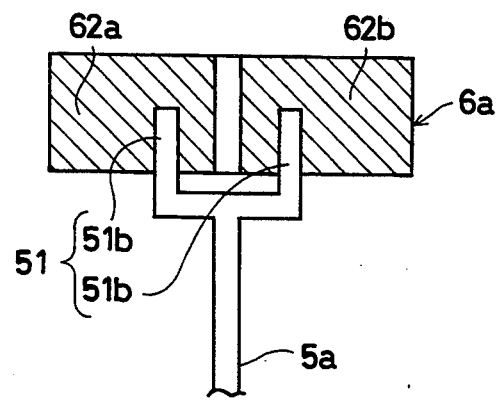
FIG. 5 is a schematic front view for explaining main parts of a composite type piezoelectric component according to still another embodiment of the present invention.

Additionally, the shape of the third terminal 5a is not limited by FIG. 5a.

Figure 4:
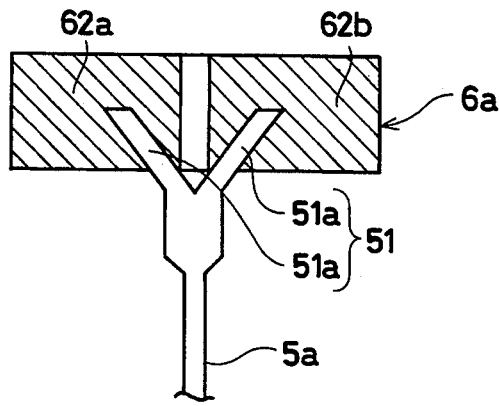
FIG. 4 is a schematic front view for explaining main parts of a composite type piezoelectric component according to another embodiment of the present invention.

In an embodiment shown in FIG. 4, the top end 51 of the third terminal 5a has two branches 51a and is in a Y shape. In another embodiment shown in FIG. 5, the top end 51 of the third terminal 5a is formed in a U shape, so that two branched portions 51b and 51b are electrically connected to electrodes 62a and 62b, respectively. Use may also be made of a V-shaped third terminal with two branched portions.

Figure 6:
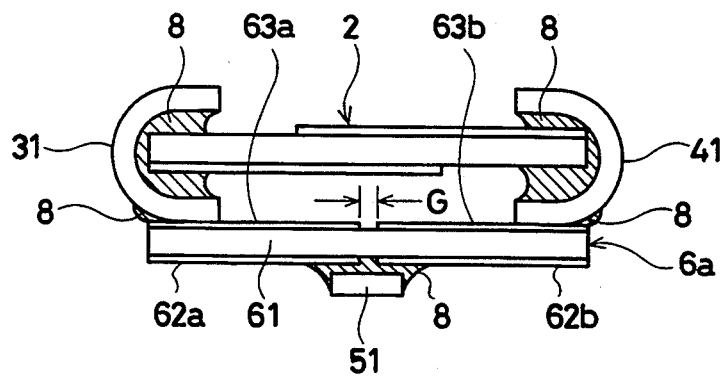
FIG. 6 is a plan view showing a composite type piezoelectric component according to a further embodiment of the present invention.

As shown in FIG. 6, the clearance G between electrodes 62a and 62b and electrodes 63a and 63b of the capacitor 6a may be made very small. If this is done, it becomes unnecessary that the top end 51 of the third terminal 5a be widened or branched as in the examples because the width of the top end 51 may already be larger than the clearance G. Accordingly, conductive junction (for example, soldering) can be achieved with the top end 51 bridging between the electrodes 62a and 62b. Numeral 3 indicates solder.

Figure 7:
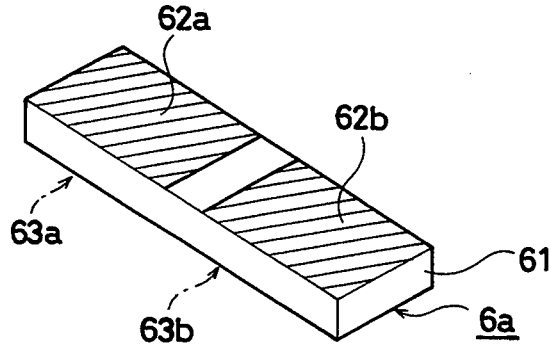
FIG. 7 is a perspective view showing one example of a capacitor used in the present invention.
Figure 8:
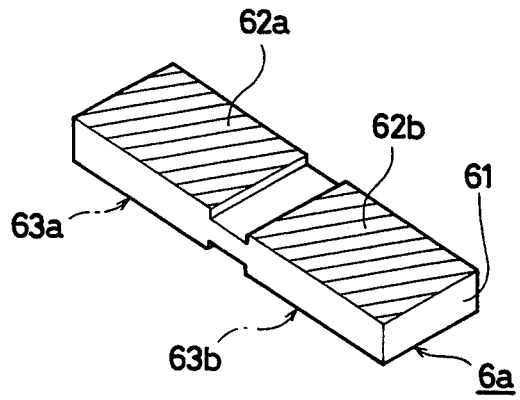
FIG. 8 is a perspective view showing another example of a capacitor used in the present invention.

The capacitor 6a in the above described examples can be easily obtained, for example, by forming a long, narrow, rectangular, planar electrode on the whole or almost all of each of the major surfaces of the dielectric substrate 61 by printing and then dividing the electrodes by etching or scribing. One example of such electrode produced by etching is shown in FIG. 7, and another example produced by scribing is shown in FIG. 8.

In summary, advantages of the present invention include the following. Firstly, since the third terminal is disposed substantially at same distances from the first and second terminals, the composite type piezoelectric component of the present invention can be easily installed on a circuit board or the like by inserting it into openings which are preliminarily formed in the board at a constant pitch. Secondly, the third terminal can be reliably connected both of a pair of divided electrodes without shifting its position because connecting pieces are formed at its top end. Thirdly, if the divided electrodes are formed substantially identically on both major surfaces of the capacitor, directionality in attaching the capacitor will not be critical and defective products are less likely to be produced by erroneously assembling the capacitor in a wrong direction.

What is claimed is:

1. A composite type piezoelectric component comprising:

a piezoelectric device having a piezoelectric substrate and electrodes formed on both major surfaces of said piezoelectric substrate;

first and second terminals having top ends which receive edge sections of said piezoelectric device therein, said first and second terminals being electrically connected individually to said electrodes on said piezoelectric device and being attached to said piezoelectric device;

a capacitor having a dielectric substrate, a first pair of divided electrodes being formed on one major surface of said dielectric substrate, a second pair of divided electrodes being formed on the other major surface of said dielectric substrate, said first and second pairs of divided electrodes forming therebetween two capacitor elements having identical capacitance, said first pair of electrodes being individually connected electrically to said first and second terminals, said capacitor being attached to said first and second terminals with a clearance left between said capacitor and said piezoelectric device; and a third terminal substantially equidistance from said first and second terminals, said third terminal having a first connector piece and a second connector piece individually connected electrically to said divided electrodes of said second pair.

2. The composite type piezoelectric component of claim 1 wherein said first and second pairs of divided electrodes are substantially identically shaped.

3. The composite type piezoelectric component of claim 2 wherein said divided electrodes of each of said pairs are substantially identically shaped with respect to each other.

4. The piezoelectric component of claim 1 wherein said third terminal is substantially T-shaped with a stem, said first and second connector pieces extending transversely therefrom.

5. The piezoelectric component of claim 1 wherein said third terminal is wider at its top end than the separation between said divided electrodes of said second pair.

6. The piezoelectric component of claim 1 wherein said third terminal has a branched top end part with two branches each connected to one of said divided electrodes of said second pair.

7. The piezoelectric component of claim 1, functional characteristics of which do not change if said capacitor is reassembled with its two major surfaces interchanged.

8. The piezoelectric component of claim 1 wherein said dielectric substrate is substantially rectangular and said divided electrodes of said first and second pairs are disposed substantially symmetrically on said major surfaces of said dielectric substrate.

9. The piezoelectric component of claim 1 wherein said top ends of said first and second terminals are each cross-sectionally U-shaped so as to be able to envelopingly receive said edge sections of said piezoelectric device.

10. A composite type piezoelectric component comprising:

a piezoelectric device having a piezoelectric substrate and electrodes formed on both major surfaces of said piezoelectric substrate;

first and second terminals having top ends receiving edge sections of said piezoelectric device therein, said first and second terminals being electrically connected individually to said electrodes on said piezoelectric device and being attached to said piezoelectric device;

a capacitor having a dielectric substrate, a first pair of divided electrodes being formed on one major surface of said dielectric substrate, a second pair of divided electrodes being formed on the other major surface of said dielectric substrate, said first and second pairs of divided electrodes being substantially identically shaped and forming therebetween two capacitor elements having identical capacitance, said first pair of electrodes being individually connected electrically to said first and second terminals, said capacitor being attached to said first and second terminals with a clearance left between said capacitor and said piezoelectric device; and a third terminal having a first connector piece and a second connector piece individually connected electrically to said divided electrodes of said second pair.

11. The composite type piezoelectric component of claim 10 wherein said divided electrodes of each of said pairs are substantially identically shaped with respect to each other.

12. The piezoelectric component of claim 10 wherein said third terminal is substantially T-shaped with a stem, said first and second connector pieces extending transversely therefrom.

13. The piezoelectric component of claim 10 wherein said third terminal is wider at its top end than the separation between said divided electrodes of said second pair.

14. The piezoelectric component of claim 10 wherein said third terminal has a branched top end part with two branches each connected to one of said divided electrodes of said second pair.

15. The piezoelectric component of claim 10, functional characteristics of which do not change if said capacitor is reassembled with its two major surfaces interchanged.

16. The piezoelectric component of claim 10 wherein said dielectric substrate is substantially rectangular and said divided electrodes of said first and second pairs are disposed substantially symmetrically on said major surfaces of said dielectric substrate.

17. The piezoelectric component of claim 10 wherein said top ends of said first and second terminals are each cross-sectionally U-shaped so as to be able to envelopingly receive said edge sections of said piezoelectric device.

* * * * *